(12) United States Patent
Liang et al.

(10) Patent No.: US 12,372,872 B2
(45) Date of Patent: Jul. 29, 2025

(54) EXTREME ULTRAVIOLET (EUV) LITHOGRAPHY USING AN INTERVENING LAYER OR A MULTI-LAYER STACK WITH VARYING MEAN FREE PATHS FOR SECONDARY ELECTRON GENERATION

(71) Applicant: LAM RESEARCH CORPORATION, Fremont, CA (US)

(72) Inventors: Andrew Liang, San Jose, CA (US); Nader Shamma, Cupertino, CA (US); Rich Wise, Los Gatos, CA (US); Akhil Singhal, Beaverton, OR (US); Arpan Pravin Mahorowala, West Linn, OR (US); Gregory Blachut, Campbell, CA (US); Dustin Zachary Austin, Tigard, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 753 days.

(21) Appl. No.: 17/595,062

(22) PCT Filed: May 15, 2020

(86) PCT No.: PCT/US2020/033047
§ 371 (c)(1),
(2) Date: Nov. 8, 2021

(87) PCT Pub. No.: WO2020/232329
PCT Pub. Date: Nov. 19, 2020

(65) Prior Publication Data
US 2022/0197147 A1 Jun. 23, 2022

Related U.S. Application Data

(60) Provisional application No. 62/849,115, filed on May 16, 2019.

(51) Int. Cl.
*G03F 7/20* (2006.01)

(52) U.S. Cl.
CPC .................................. *G03F 7/2004* (2013.01)

(58) Field of Classification Search
None
See application file for complete search history.

(56) References Cited

U.S. PATENT DOCUMENTS 8,257,910 B1 * 9/2012 Guerrero ................. G03F 7/091
430/322
9,929,012 B1 3/2018 Belyansky et al.
(Continued)

FOREIGN PATENT DOCUMENTS

CN 106462060 A 2/2017
CN 113574456 A 10/2021
(Continued)

OTHER PUBLICATIONS

Chinese Office Action for Chinese Application No. CN202080036400.1 dated Oct. 25, 2023.
(Continued)

*Primary Examiner* — Jonathan Johnson
*Assistant Examiner* — Andrew Preston Traywick

(57) ABSTRACT

A method for patterning a substrate includes providing a substrate, and depositing a multi-layer stack including N layers on the substrate. N is an integer greater than one. The N layers include N mean free paths for secondary electrons, respectively. The method includes depositing a photoresist layer on the multi-layer stack, wherein the N mean free paths converge in the photoresist layer. Another method for patterning a substrate includes providing a substrate and depositing a layer on the substrate. The layer includes varying mean free paths for secondary electrons. The method includes depositing a photoresist layer on the layer. The (Continued)

varying mean free paths for secondary electrons converge in the photoresist layer.

13 Claims, 2 Drawing Sheets

(56) References Cited

U.S. PATENT DOCUMENTS

| | | | |
|---|---|---|---|
| 10,599,032 B2* | 3/2020 | Lewis | G03F 7/168 |
| 2013/0129995 A1* | 5/2013 | Ouattara | G03F 7/092 |
| | | | 428/209 |
| 2015/0042972 A1* | 2/2015 | Wise | G03F 7/70325 |
| | | | 355/67 |
| 2017/0271150 A1* | 9/2017 | Chang | G03F 7/11 |
| 2018/0166278 A1* | 6/2018 | Belyansky | H01L 21/02356 |

FOREIGN PATENT DOCUMENTS

| | | |
|---|---|---|
| TW | I275129 B | 3/2007 |
| TW | 201727735 A | 8/2017 |
| TW | 201807741 A | 3/2018 |
| WO | WO-2005114332 A1 | 12/2005 |

OTHER PUBLICATIONS

Taiwanese Office Action for Taiwanese Application No. 109116186 dated Oct. 25, 2023.
International Search Report and Written Opinion of the ISA issued in PCT/US2020/033047, mailed Oct. 8, 2020; ISA/KR.

* cited by examiner

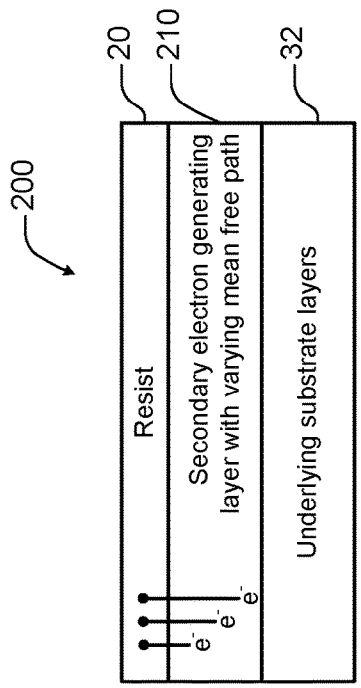
FIG. 4
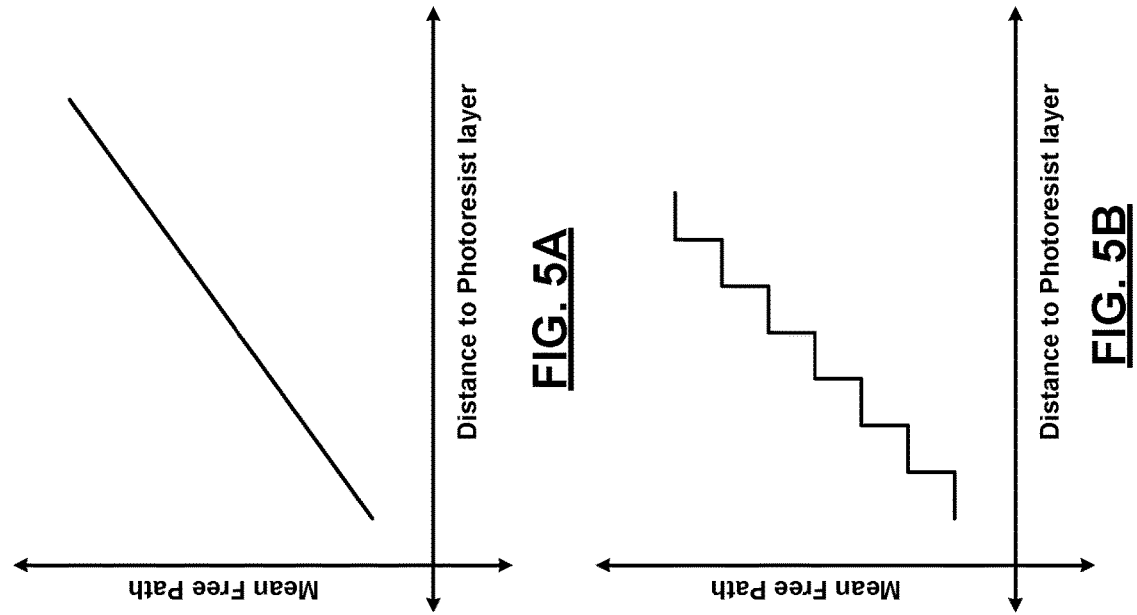
FIG. 5A
FIG. 5B
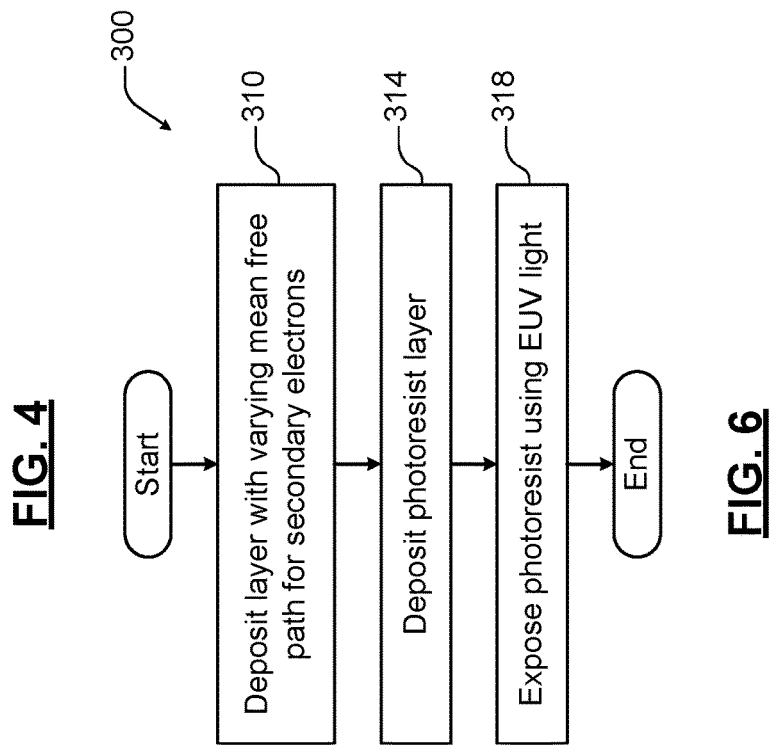
FIG. 6

EXTREME ULTRAVIOLET (EUV) LITHOGRAPHY USING AN INTERVENING LAYER OR A MULTI-LAYER STACK WITH VARYING MEAN FREE PATHS FOR SECONDARY ELECTRON GENERATION

CROSS-REFERENCE TO RELATED APPLICATIONS

This application is a U.S. National Phase Application under 35 U.S.C. 371 of International Application No. PCT/US2020/033047, filed on May 15, 2020, which claims the benefit of U.S. Provisional Application No. 62/849,115, filed on May 16, 2019. The entire disclosures of the applications referenced above are incorporated herein by reference.

FIELD

The present disclosure relates to substrate processing systems and more particularly to EUV photolithography using an intervening layer or a multi-layer stack with varying mean free paths for secondary electron generation.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Advanced photolithography is typically performed using excimer lasers, which have a wavelength of 193 nm. To create feature sizes that are smaller than 193 nm, additional techniques such as multi-patterning, immersion and/or optical proximity correction can be performed to significantly increase resolution below 193 nm. However, further decreases to feature sizes using this type of photolithography are not possible.

Next generation photolithography techniques use extreme ultraviolet (EUV) wavelengths. In EUV photolithography, a power source converts plasma into light at 13.5 nm, which is 14 times shorter than 193 nm. However, the shorter EUV wavelengths require substantial changes to the photolithography process since most materials readily absorb photons at EUV wavelengths. For example, EUV photolithography utilize multiple mirrors to reflect light rather than using lenses. The EUV photolithography process is also performed in a vacuum environment. Plasma sources are used instead of lasers to generate photons for printing.

EUV radiation that is reflected by a mask pattern onto a photoresist layer. The photoresist layer absorbs EUV photons and generates secondary electrons. More particularly, EUV photons with sufficient energy ionize atoms in the photoresist layer, which releases secondary electrons.

EUV photolithography is particularly sensitive to stochastic effects. When printing features using EUV, most features are resolved. Due to stochastic variations in arriving photon numbers, some regions designated to print actually fail to reach the threshold to print, which leaves unexposed regions or defects. The rate of failure is related to the dose level. However, increasing the dose level is difficult in EUV-based photolithography systems. Parameters such as dose-to-size and dose-to-defect may be used to characterize performance in EUV-based systems.

SUMMARY

A method for patterning a substrate comprises providing a substrate, and depositing a multi-layer stack including N layers on the substrate. N is an integer greater than one. The N layers include N mean free paths for secondary electrons, respectively. The method comprises depositing a photoresist layer on the multi-layer stack, wherein the N mean free paths converge in the photoresist layer.

In another feature, the N mean free paths of the N layers are different.

In other features, the N layers are located at N distances from the photoresist layer, and the N mean free paths of the N layers increase with the N distances, respectively.

In other features, the N layers are located at N distances from the photoresist layer, and the N mean free paths of the N layers monotonically increase with the N distances, respectively.

In other features, the N layers are located at N distances from the photoresist layer, and the N mean free paths of the N layers linearly increase with the N distances, respectively.

In other features, the N layers are located at N distances from the photoresist layer respectively have N absorption rates; and the N absorption rates of the N layers, respectively, increase as the N distances increase.

In another feature, each layer of the N layers has the same thickness.

In another feature, each layer of the N layers has a different thickness.

In another feature, the method further comprises arranging the N layers in an increasing order of thickness, with a thinnest layer of the N layers arranged adjacent to the photoresist layer and with a thickest layer of the N layers arranged adjacent to the substrate.

In another feature, the method further comprises exposing the photoresist layer to extreme ultraviolet radiation.

In other features, the method further comprises exposing the photoresist layer to extreme ultraviolet radiation and removing exposed portions of the photoresist layer. The method further comprises removing portions of the multi-layer stack located in areas where the photoresist layer is removed.

In other features, the method further comprises exposing the photoresist layer to extreme ultraviolet radiation and removing exposed portions of the photoresist layer to form a patterned photoresist layer. The method further comprises performing a deposition process using the patterned photoresist layer and removing the photoresist layer and the multi-layer stack after performing the deposition process.

In other features, the method further comprises exposing the photoresist layer to extreme ultraviolet radiation and removing exposed portions of the photoresist layer to form a patterned photoresist layer. The method further comprises performing an etching process using the patterned photoresist layer and removing the photoresist layer and the multi-layer stack after performing the etching process.

In still other features, a method for patterning a substrate comprises providing a substrate and depositing a layer on the substrate. The layer includes varying mean free paths for secondary electrons. The method comprises depositing a photoresist layer on the layer. The varying mean free paths for secondary electrons converge in the photoresist layer.

In another feature, the varying mean free paths of the layer monotonically increase with a distance to the photoresist layer.

In another feature, the varying mean free paths of the layer linearly increase with a distance to the photoresist layer.

In another feature, the varying mean free paths of the layer increase in steps as a function of a distance to the photoresist layer.

In another feature, the method further comprises exposing the photoresist layer to extreme ultraviolet radiation.

In other features, the method further comprises exposing the photoresist layer to extreme ultraviolet radiation and removing exposed portions of the photoresist layer. The method further comprises removing portions of the layer located in areas where the photoresist layer is removed.

In other features, the method further comprises exposing the substrate to extreme ultraviolet radiation and removing exposed portions of the photoresist layer to form a patterned photoresist layer. The method further comprises performing a deposition process using the patterned photoresist layer and removing the layer and the photoresist layer after performing the deposition process.

In other features, the method further comprises exposing the substrate to extreme ultraviolet radiation and removing exposed portions of the photoresist layer to form a patterned photoresist layer. The method further comprises performing an etching process using the patterned photoresist layer and removing the layer and the photoresist layer after performing the etching process.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 4 is side cross-sectional view of an example of a substrate including a layer with a varying mean free path located between a photoresist layer and an underlying substrate according to the present disclosure;

FIGS. 5A and 5B are graphs illustrating examples of variations in the mean free path in the layer of FIG. 4; and FIG. 6 is a flowchart of an example of a method for patterning a substrate using the EUV photolithography according to the present disclosure.

In the drawings, reference numbers may be reused to identify similar and/or identical elements.

DETAILED DESCRIPTION

Since the dose level of available EUV sources is limited, several techniques have been used to make better use of the available dose levels from the EUV sources. For example, a layer of film may be deposited between the photoresist layer and the underlying substrate. The layer enhances secondary electron generation, which improves dose-to-size and dose-to-defect parameters. However, this approach produces only a limited improvement in that the secondary electron generating layer can only produce a finite number of secondary electrons.

Another approach improves dose-to-size and dose-to-defect using plasma etch smoothing techniques. By improving resist roughness, stochastic failures are mitigated, and lower dose specifications can be used for both size and defectivity. This approach also produces a finite limit on dose gains. However, this approach may be difficult to scale. As lithographic patterning films become thinner, etch techniques to improve roughness may become more limited as selectivity becomes a more critical consideration.

Another approach is to increase the sensitivity of the photoresist layer. However, this approach requires a trade-off in dose, resolution, and roughness. As the sensitivity increases, either resolution or roughness must degrade, both of which are undesirable.

A method for patterning substrates according to the present disclosure provides improvements in dose-to-size and dose-to-defect parameters for EUV photolithography. According to some examples of the present disclosure, a multi-layer stack is deposited between the photoresist layer and the underlying substrate. Different layers of the multi-layer stack produce secondary electrons having different mean free paths. In some examples, the mean free paths of the layers in the multi-layer stack increase as a distance from the photoresist layer increases.

When using a single, uniform layer as described above, the secondary electrons that are produced have a single mean free path, which results in a finite secondary electron density that can penetrate the photoresist layer. To overcome this limitation, the multi-layer stack includes multiple layers having different mean free paths for secondary electrons. In some examples, the mean free paths of the layers converge in the photoresist layer. For example, layers in the multi-layer stack that are located at a greater distance from the photoresist layer have a higher mean free path for secondary electrons as compared to layers that are located closer to the photoresist layer.

Figure 1:
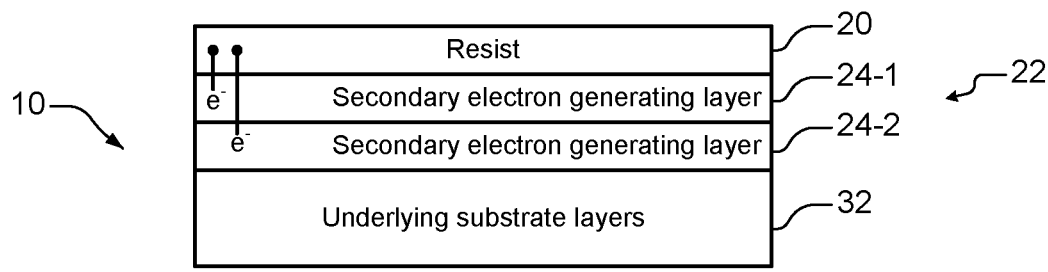
FIGS. 1 and 2 are side cross-sectional views of examples of substrates including a multi-layer stack with layers producing secondary electrons with varying mean free paths according to the present disclosure.
Figure 2:
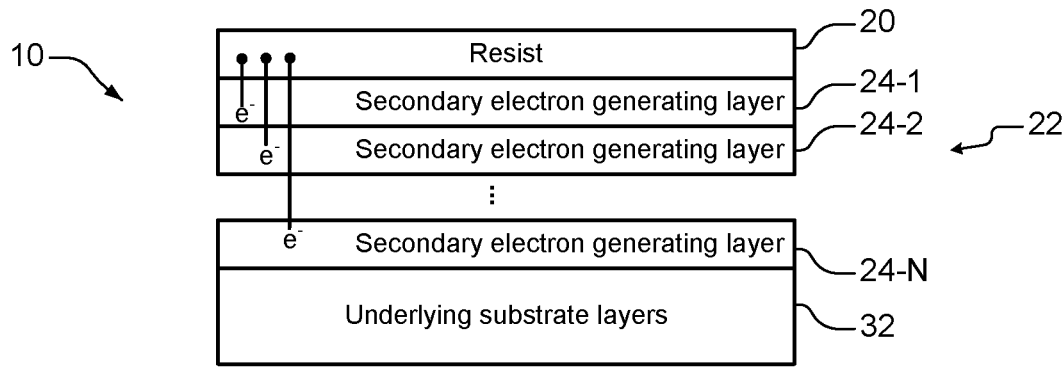

Referring now to FIGS. 1 and 2, a substrate 10 includes a photoresist layer 20 that is to be patterned. The photoresist layer 20 is deposited on a multi-layer stack 22. The multi-layer stack 22 includes a layer 24-1 having a first mean free path for secondary electrons and a layer 24-1 having a second mean path for secondary electrons that is different than the first mean free path. The multi-layer stack 22 is deposited on underlying substrate layers 32.

After depositing the photoresist layer 20 and the multi-layer stack 22, the substrate 10 is exposed to EUV radiation reflected from a mask pattern. In some examples, one or more additional steps may be performed to remove the exposed (or unexposed) photoresist layer and/or portions of the multi-layer stack located in areas where the photoresist layer is removed. Additional processing such as deposition and/or etching can be performed using the patterned photoresist layer 20. After the additional processing is performed, the photoresist layer 20 and the multi-layer stack 22 are removed.

In FIG. 2, N secondary electron generating layers 24-N can be used where N is an integer greater than one. In some examples, the N secondary electron generating layers 24-N have a different mean free paths. For example when N=3, the layer 24-3 has a longest mean free path terminating in the photoresist layer 20, the layer 24-2 has a middle mean free path terminating in the photoresist layer 20, and the layer 24-1 has the shortest mean free path terminating in the photoresist layer 20.

Figure 3:
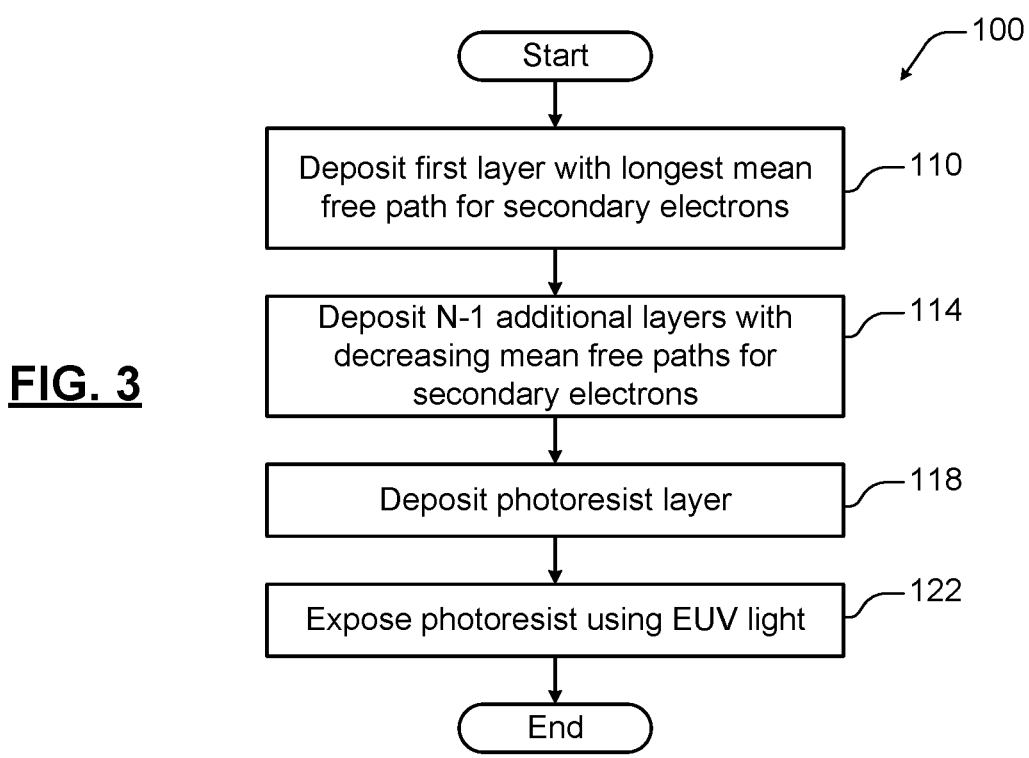
FIG. 3 is a flowchart of an example of a method for patterning a substrate using EUV photolithography, according to the present disclosure.

Referring now to FIG. 3, a method 100 for patterning a substrate using EUV and a stack including layers with different mean free paths is shown. The method 100 includes depositing a first layer of multi-layer stack 22 with the longest mean free path for secondary electrons on the underlying substrate 32 at 110. At 114, N−1 additional layers are deposited on the first layer of the multi-layer stack 22. The N−1 additional layers have different mean free paths for secondary electrons than the first layer. In some examples, successive deposited layers of the multi-layer stack 22 have a lower mean free path than preceding deposited layers of the multi-layer stack 22. At 118, the photoresist layer 20 is deposited on the multi-layer stack 22. At 122, selected portions of the photoresist layer are exposed using EUV light and further processing is performed as described above.

In some examples, the layer that is farthest from the photoresist layer 20 produces secondary electrons with the longest mean free path. The mean free paths of the other layers in the multi-layer stack 22 are then targeted so that they converge at approximately the same depth in the photoresist layer 20. In the example above with N=3, the number of secondary electron that reach the photoresist layer 20 is approximately tripled. As a result, the dose that is required can be reduced by a factor of approximately 3.

In some examples, the mean free path of the secondary electrons in each layer is controlled by selecting different materials for the corresponding layers. For example, materials having different absorption can be used. Highly absorbing materials tend to have shorter mean free paths. In some examples, the multi-layer stack 22 includes a highly absorbing layer at the top of the multi-layer stack 22 and gradually lower absorbing layers towards the bottom of the multi-layer stack.

Referring now to FIG. 4, a substrate 200 includes a photoresist layer 20 that is to be patterned. The photoresist layer 20 is deposited on a layer 210 having a mean free path that varies with depth. In some examples, the mean free path increases continuously, monotonically or in steps as a vertical distance from the photoresist layer 20 increases.

After depositing the photoresist layer 20 and the layer 210 on the underlying substrate layers 32, the substrate 200 is exposed to EUV radiation reflected from the mask pattern. In some examples, one or more additional steps may be performed to remove the exposed (or unexposed) photoresist and/or the layer 210 that is located in areas where the photoresist layer 20 is removed. Additional processing such as deposition and/or etching can be performed using the photoresist layer 20 that was patterned. After the additional processing is performed, the photoresist layer 20 and the layer 210 are removed.

Referring now to FIGS. 5A and 5B, there are many ways to vary the mean free path in the layer 210. For example, the mean free path can increase with the distance (linearly, monotonically, in steps, etc.). In FIG. 5A, the mean free path increases linearly with the distance. In FIG. 5B, the mean free path increases in steps as a function of the distance to the photoresist layer.

Referring now to FIG. 6, a method 300 for patterning a substrate using the EUV photolithography, the photoresist layer 20 and the layer 210 with varying mean free paths is shown. The method 300 includes depositing the layer 20 with varying mean free paths for secondary electrons on underlying substrate layers 32 at 310. At 314, the photoresist layer 20 is deposited on the layer 210. At 318, selected portions of the photoresist layer 20 are exposed using EUV light and further processing is performed as described above.

In other examples, the amount of the localized dose increase can also be modified by scaling the mean free path of all layers.

Absorption of EUV photons in the underlayer stack leads to generation of photo-electrons (aka primary electrons). Primary electrons with sufficient energy will ionize atoms, releasing secondary electrons.

In a uniform layer, the secondary electrons' inelastic mean free path (IMFP) is a function of electron energy, which results in a finite secondary electron density that can penetrate the photoresist. To enhance the energy deposited by the secondary electrons into the photoresist, a multi-layer film can be developed where, within a critical range of electron energies, the film exhibits a longer IMFP for secondary electrons that are generated further from the photoresist.

Layers that are farther from the photoresist produce secondary electrons with higher mean free paths (within the critical range of electron energies that can lead to the desired chemical reactions in the photoresist). Layers that are closer to the photoresist produce secondary electrons lower mean free paths (within the critical range of electron energies that can lead to the desired chemical reactions in the photoresist).

In the examples above, the number of generated secondary electrons that reach the photoresist are expected to increase as a result of the arrangement of the multi-layer stack. One potential property for modifying the mean free path is to change the film density. Higher density is expected to lead to shorter mean free paths, so a potential stack consists of a higher density film at the top with gradually lower density films towards the bottom of the multilayer stack. The multilayer film is also not restricted to separate materials and may be a single material with a gradient. The thickness of the photoresist within which a significant change in effective dose is achieved can be modified by scaling the IMFP of all layers. Material examples are shown in the table below.

| Layer | Example Material | Deposition Method | Solubility in Aqueous Developer | Density | IMFP |
|---|---|---|---|---|---|
| Top Layer (photoactive) | chemically amplified organic photoresist (CAR) | spin coat/CVD/ALD | High (exposed regions) | N/A | N/A |
| Underlayer 1 | Sn or SnO2 | CVD/ALD/PECVD/PVD | None (extremely low) | higher | lower |
| Underlayer 2 | Si or SiON | CVD/ALD/PECVD/PVD | None to low (not exposed to developer) | lower | higher |

In the multilayer stack configuration, the thickness of each layer can be the same or different. In some examples, the total thickness of the multilayer stack may not exceed a predetermined thickness (e.g., 10 nm). When the thicknesses of the layers in the multilayer stack are different, the layers are arranged in monotonically increasing order of thickness from the top of the stack to the bottom of the stack. The thinnest layer is arranged at the top of the stack directly below the photoresist, and the thickest layer is arranged at the bottom of the stack directly above the substrate.

In one example, the multilayer stack may include 2-4 layers, and the total thickness of the multilayer stack may be 5 nm. For example, the multilayer stack may include 2 layers each having a thickness of 2.5 nm. For example, the multilayer stack may include 4 layers each having a thickness of 1.25 nm. For example, the multi-layer stack may include 2 layers: one layer having a thickness of 2 nm arranged directly below the photoresist layer and another layer having a thickness of 3 nm arranged directly below the 2 nm layer and directly above the substrate.

In another example, the multilayer stack may include 2-4 layers, and the total thickness of the multilayer stack may be 10 nm. For example, the multilayer stack may include 2 layers each having a thickness of 5 nm. For example, the multilayer stack may include 4 layers each having a thickness of 2.5 nm. For example, the multi-layer stack may include 2 layers: one layer having a thickness of 4 nm arranged directly below the photoresist layer and another layer having a thickness of 6 nm arranged directly below the 2 nm layer and directly above the substrate. For example, the multilayer stack may include 3 layers: a first layer having a thickness of 2 nm, which is arranged directly below the photoresist layer, a second layer having a thickness of 3 nm arranged directly below the first layer, a third layer having a thickness of 5 nm arranged directly below the 3 nm layer and directly above the substrate. Various other examples are contemplated.

For some example single layer configurations, the thickness of the single layer with varying mean free paths may not exceed a predetermined thickness (e.g., 10 nm). Further, in either configuration, the thickness of the photoresist layer may be between 20 nm and 40 nm, for example. The methods of the present disclosure reduce the EUV dose by about 10%, which translates into significant cost savings.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for patterning a substrate, comprising:
   depositing a first layer on a substrate, the first layer comprising Si or SiON and having a first thickness of 3 nm or 6 nm, wherein the first layer includes a first mean free path for secondary electrons;
   depositing a second layer on the first layer, the second layer comprising Sn or SnO2 and having a second thickness, wherein the second thickness is 2 nm or 4 nm when the first thickness is 3 nm or 6 nm, respectively, and wherein the second layer includes a second mean free path for secondary electrons that is lower than the first mean free path; and
   depositing a photoresist layer on the second layer, the photoresist layer comprising chemically amplified organic photoresist material, wherein the first and second mean free paths converge in the photoresist layer.

2. The method of claim 1, wherein the first and second mean free paths of the first and second layers are different.

3. The method of claim 1, wherein the first and second layers are located at first and second distances from the photoresist layer, respectively; and wherein the first and second mean free paths of the first and second N-layers increase proportionally with the first and second distances.

4. The method of claim 1, wherein the first and second layers are located at first and second distances from the photoresist layer, respectively; and wherein the first and second mean free paths of the first and second layers monotonically increase according to the first and second distances.

5. The method of claim 1, wherein the first and second layers are located at first and second distances from the photoresist layer, respectively; and wherein the first and second mean free paths of the first and second layers linearly increase according to the first and second distances.

6. The method of claim 1, wherein the first and second layers are located at first and second distances from the photoresist layer, respectively, and have first and second absorption rates, respectively; and wherein the first and second absorption rates of the first and second layers, respectively, increase as according to the first and second distances.

7. The method of claim 1, wherein each layer of the first and second layers has the same thickness.

8. The method of claim 1, wherein each layer of the first and second layers has a different thickness.

9. The method of claim 8 further comprising arranging the first and second layers in an increasing order of thickness, with a thinner layer of the first and second layers arranged adjacent to the photoresist layer and with a thicker layer of the first and second layers arranged adjacent to the substrate.

10. The method of claim 1 further comprising exposing the photoresist layer to extreme ultraviolet radiation.

11. The method of claim 1 further comprising:
    exposing the photoresist layer to extreme ultraviolet radiation;
    removing exposed portions of the photoresist layer; and
    removing portions of the multi-layer stack located in areas where the photoresist layer is removed.

12. The method of claim 1 further comprising:
exposing the photoresist layer to extreme ultraviolet radiation;
removing exposed portions of the photoresist layer to form a patterned photoresist layer;
performing a deposition process using the patterned photoresist layer; and
removing the photoresist layer and the multi-layer stack after performing the deposition process.

13. The method of claim 1 further comprising:
exposing the photoresist layer to extreme ultraviolet radiation;
removing exposed portions of the photoresist layer to form a patterned photoresist layer;
performing an etching process using the patterned photoresist layer; and
removing the photoresist layer and the multi-layer stack after performing the etching process.

* * * * *